(12) United States Patent
Guo et al.

(10) Patent No.: US 12,218,395 B2
(45) Date of Patent: Feb. 4, 2025

(54) PHASE SHIFTER IN WHICH AT LEAST SOME OF FIRST SUB-ELECTRODES ARE SHORT-CIRCUITED TOGETHER AND CONNECTED TO A SAME CONNECTION PORTION

(71) Applicant: BOE TECHNOLOGY GROUP CO., LTD., Beijing (CN)

(72) Inventors: Jingwen Guo, Beijing (CN); Chunxin Li, Beijing (CN); Qianhong Wu, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 712 days.

(21) Appl. No.: 17/490,484

(22) Filed: Sep. 30, 2021

(65) Prior Publication Data
US 2022/0231392 A1    Jul. 21, 2022

(30) Foreign Application Priority Data

Jan. 19, 2021 (CN) .......................... 202110068447.2

(51) Int. Cl.
*H01P 1/18*         (2006.01)
*B81B 7/02*         (2006.01)

(52) U.S. Cl.
CPC .............. *H01P 1/184* (2013.01); *B81B 7/02* (2013.01); *H01P 1/18* (2013.01); *B81B 2203/04* (2013.01); *B81B 2207/07* (2013.01)

(58) Field of Classification Search
CPC ... H01P 1/184; H01P 1/18; B81B 7/02; B81B 2203/04; B81B 2207/07
See application file for complete search history.

(56) References Cited

U.S. PATENT DOCUMENTS 6,741,207 B1 * 5/2004 Allison .................. H01P 1/184
                                               333/164
7,045,440 B2 * 5/2006 Huff ........................ H01Q 1/38
                                               438/126

* cited by examiner

*Primary Examiner* — Emily P Pham
(74) *Attorney, Agent, or Firm* — HOUTTEMAN LAW LLC

(57) ABSTRACT

A phase shifter includes: a first substrate; a signal electrode and a reference electrode on at least one side of an extension direction of the signal electrode; a first insulating layer covering the reference and signal electrodes; and at least one phase controlling unit above the first insulating layer. Each phase controlling unit includes a main body portion and at least one connection portion. Orthogonal projections of the main body portion and the signal electrode on the first substrate at least partially overlap each other. The main body portion and the first insulating layer have a gap therebetween, and the connection portion is connected between the main body portion and a portion of the first insulating layer covering the reference electrode. The main body portion includes first sub-electrodes short-circuited with each other, and at least some of the first sub-electrodes are connected to a same connection portion.

20 Claims, 5 Drawing Sheets

PHASE SHIFTER IN WHICH AT LEAST SOME OF FIRST SUB-ELECTRODES ARE SHORT-CIRCUITED TOGETHER AND CONNECTED TO A SAME CONNECTION PORTION

CROSS REFERENCE TO RELATED APPLICATIONS

The present application claims priority to Chinese patent application No. 202110068447.2, filed on Jan. 19, 2021, the content of which is incorporated herein by reference in its entirety.

TECHNICAL FIELD

The present disclosure relates to the field of communication technology, and in particular to a phase shifter.

BACKGROUND

As the information age develops rapidly, wireless terminals with high integration, miniaturization, multifunction, and low cost have gradually become a trend of the communication technology. Phase shifters are essential key components in communication applications and radar applications. Traditional phase shifters mainly include a ferrite phase shifter and a semiconductor phase shifter, in which the ferrite phase shifter has a larger power capacity and a smaller insertion loss, but large-scale application of the ferrite phase shifter is limited by factors such as a complex process, a high manufacturing cost, a large volume and the like of the ferrite phase shifter; the semiconductor phase shifter has a smaller volume, a higher operating speed, but has a smaller power capacity, a larger power consumption and a higher difficulty of manufacturing process.

Compared with the traditional phase shifters, an existing Micro-Electro-Mechanical System (MEMS) phase shifter has significant advantages in the aspects of insertion loss, power consumption, volume, cost and the like, and has attracted wide attention in the fields of radio communication, microwave technology and the like. However, the existing MEMS phase shifter has a disadvantage of difficulty in large-scale production due to a relatively complex manufacturing process, poor device stability and poor device consistency, and requires a large driving voltage.

SUMMARY

Some embodiments of the present disclosure provide a phase shifter.

The phase shifter provided by the embodiments of the present disclosure includes:
a first substrate;
a signal electrode and a reference electrode on at least one side of an extension direction of the signal electrode, wherein both the signal electrode and the reference electrode are on the first substrate;
a first insulating layer on a side of the reference electrode and the signal electrode distal to the first substrate; and
at least one phase controlling unit on a side of the first insulating layer distal to the first substrate, wherein each phase controlling unit includes a main body portion and at least one connection portion, an orthogonal projection of the main body portion on the first substrate at least partially overlaps an orthogonal projection of the signal electrode on the first substrate, the main body portion and the first insulating layer have a gap therebetween, and the at least one connection portion is connected between the main body portion and a portion of the first insulating layer covering the reference electrode;
wherein the main body portion includes a plurality of first sub-electrodes short-circuited with each other, and at least some of the plurality of first sub-electrodes are connected to a same connection portion.

In some embodiments, the main body portion further includes a first short-circuiting portion and a second short-circuiting portion, one end of each of the plurality of first sub-electrodes is connected to the first short-circuiting portion, and the other end of each of the plurality of first sub-electrodes is connected to the second short-circuiting portion; and
the at least one connection portion is connected to one of the first short-circuiting portion and the second short-circuiting portion.

In some embodiments, the reference electrode includes a first reference electrode and a second reference electrode, which are on both sides of the extension direction of the signal electrode, respectively; and
each phase controlling unit includes a plurality of connection portions which are equally divided into two groups, one group of which is connected between the first short-circuiting portion and a portion of the first insulating layer covering the first reference electrode, and the other group thereof is connected between the second short-circuiting portion and a portion of the first insulating layer covering the second reference electrode.

In some embodiments, the plurality of first sub-electrodes of each phase controlling unit have a one-piece structure and form a sheet-like structure, the at least one connection portion is connected between the sheet-like structure and the portion of the first insulating layer covering the reference electrode.

In some embodiments, the reference electrode includes a first reference electrode and a second reference electrode, which are on both sides of the extension direction of the signal electrode, respectively; and
each phase controlling unit includes a plurality of connection portions which are equally divided into two groups, one of which is connected between a side of the sheet-like structure proximal to the first reference electrode and a portion of the first insulating layer covering the first reference electrode, and the other thereof is connected between a side of the sheet-like structure proximal to the second reference electrode and a portion of the first insulating layer covering the second reference electrode.

In some embodiments, a number of the connection portions in either of the two groups of a phase controlling unit is less than or equal to one half of a number of the first sub-electrodes of the phase controlling unit.

In some embodiments, the plurality of first sub-electrodes have a same width, and a distance between any adjacent two of the plurality of first sub-electrodes is a constant.

In some embodiments, the phase shifter further includes: a controller unit and a plurality of signal lines, one end of each signal line is connected to the controller unit, and the other end of each signal line is connected to any one of the at least one connection portion in one of the at least one phase controlling unit.

In some embodiments, the phase shifter further includes:

a second substrate opposite to the first substrate and on a side of the at least one phase controlling unit distal to the first substrate, and the second substrate and the at least one phase controlling unit have a gap therebetween; and a sealing structure between the first substrate and the second substrate and in a peripheral region of the first substrate, and an orthogonal projection of the sealing structure on the first substrate does not overlap an orthogonal projection of the at least one phase controlling unit on the first substrate.

In some embodiments, the sealing structure includes a heat insulating material.

In some embodiments, the phase shifter further includes: at least one heat insulating layer on a side, which is distal to the at least one phase controlling unit, of at least one of the first substrate and the second substrate.

In some embodiments, the at least one heat insulating layer includes a first heat insulating layer and a second heat insulating layer, the first heat insulating layer is on the side, which is distal to the at least one phase controlling unit, of the first substrate, and the second heat insulating layer is on the side, which is distal to the at least one phase controlling unit, of the second substrate.

In some embodiments, the phase shifter further includes: a plurality of spacers between the first substrate and the second substrate, and on a side of the sealing structure proximal to the at least one phase controlling unit.

In some embodiments, at least one of the first substrate and the second substrate is a glass substrate or a silicon-based substrate.

In some embodiments, the plurality of first sub-electrodes have a same distance from the signal electrode.

In some embodiments, all of the first sub-electrodes of the at least one phase controlling unit have the same distance from the signal electrode.

In some embodiments, the plurality of first sub-electrodes are parallel to each other.

In some embodiments, all of the first sub-electrodes of the at least one phase controlling unit are parallel to each other.

In some embodiments, each of the at least one heat insulating layer includes a thermal insulation ceramic or an organic film.

DETAILED DESCRIPTION

Figure 1:
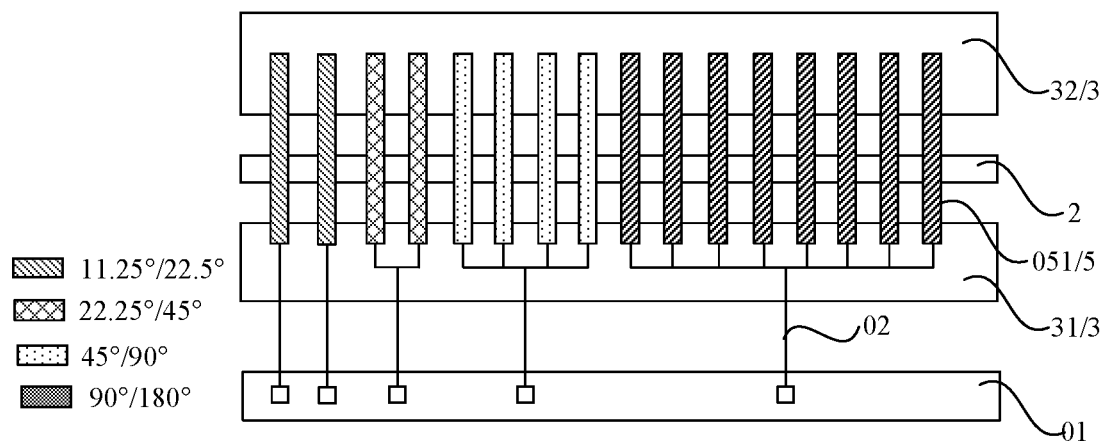
FIG. 1 is a schematic diagram (e.g., a top view) showing a structure of a phase shifter according to an embodiment of the present disclosure.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein shall have the ordinary meaning as understood by one of ordinary skill in the art to which the present disclosure belongs. The terms "first", "second", and the like used herein are not intended to indicate any order, quantity, or importance, but rather are used for distinguishing one element from another. Further, the terms "a", "an", "the", or the like used herein does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

It should be noted that in the present disclosure, two structures disposed "in a same layer" means that the two structures are formed of a same material and are therefore in the same layer in a stacked relationship, but does not mean that they have a same distance from a substrate or that other layer structures between them and the substrate are completely the same.

The present disclosure will be described in more detail below with reference to the accompanying drawings. Like elements are denoted by like reference numerals throughout the drawings. For purposes of clarity, various features in the drawings are not necessarily drawn to scale. Further, certain well-known elements may not be shown in the drawings.

FIG. 1 illustrates a structure of a phase shifter according to an embodiment of the present disclosure. Referring to FIG. 1, the phase shifter includes a first substrate (not shown in FIG. 1, reference may be made to a first substrate 1 in each of FIGS. 3, 6, 10 and 11), a signal electrode 2, a reference electrode 3, a first insulating layer (not shown in FIG. 1, reference may be made to a first insulating layer 4 in each of FIGS. 3, 6, 10 and 11), a plurality of phase controlling units 5, a controller unit 01, and signal lines 02.

Specifically, the signal electrode 2 is disposed on the first substrate, and the reference electrode 3 is disposed on the first substrate and on at least one side of the signal electrode 2. The present embodiment is described by taking as an example in which the reference electrode 3 includes a first reference electrode 31 and a second reference electrode 32 respectively disposed on both sides of the signal electrode 2. The signal electrode 2 and the reference electrode 3 are arranged in a same layer and spaced apart from each other. The first insulating layer is arranged on a side of the signal electrode 2 and the reference electrode 3 distal to the first substrate, and covers the signal electrode 2 and the reference electrode 3.

The plurality of phase controlling units 5 are arranged on a side of the first insulating layer distal to the first substrate. Each phase controlling unit 5 has at least one electrode film bridge 051, each of which is bridged (or spaned) between the first reference electrode 31 and the second reference electrode 32. That is, each electrode film bridge 051 includes at least one support portion (e.g., two support portions) and a bridge floor portion, and each support portion includes two ends, one of which is connected to the bridge floor portion, and the other is fixed on (or connected to) the first insulating layer covering the reference electrode 3 (i.e., the first reference electrode 31 or the second reference electrode 32), such that the bridge floor portion of the electrode film bridge 051 is suspended (or hung) above the signal electrode 2. That is, the bridge floor portion of each electrode film bridge 051 and the signal electrode 2 have a gap therebetween, and an orthogonal projection of each electrode film bridge 051 on the first substrate at least partially overlaps an orthogonal projection of the signal electrode 2 on the first substrate. In this way, in a case where a direct current (DC) bias voltage (e.g., a voltage that enables the phase shifter to operate normally) is input across at least one electrode film bridge 051 and the signal electrode 2, the at least one electrode film bridge 051 and the signal electrode 2 may form a capacitor. Further, the bridge floor portion of each electrode film bridge 051 has a certain elasticity, and when a direct current bias voltage is input to an electrode film bridge 051, the bridge floor portion of the electrode film bridge 051 can be driven to move in a direction perpendicular to the signal electrode 2. That is, by inputting a DC bias voltage to an electrode film bridge 051, a distance between the bridge floor portion of the electrode film bridge 051 and the signal electrode 2 can be changed, and a capacitance of the capacitor formed by the bridge floor portion of the electrode film bridge 051 and the signal electrode 2 can be changed. Further, the number of electrode film bridges 051 included in different phase controlling units 5 may be different (e.g., the phase shifter shown in FIG. 1 may include five phase controlling units 5 in total which are first to fifth phase controlling units 5, in which the first phase controlling unit 5 may include 1 (i.e., one) electrode film bridge 051, the second phase controlling unit 5 may include 1 (i.e., one) electrode film bridge 051, the third phase controlling unit 5 may include 2 electrode film bridges 051, the fourth phase controlling unit 5 may include 4 electrode film bridges 051, and the fifth phase controlling unit 5 may include 8 electrode film bridges 051), the electrode film bridges 051 of a same phase controlling unit 5 are all connected to one output port (which is, for example, shown by a rectangular box on the controller unit 01 shown in FIG. 1) of the controller unit 01 through a signal line 02 to receive the DC bias voltage output from the controller unit 01. When a DC bias voltage is applied across a certain number of electrode film bridges 051 in different phase controlling units 5 and the signal electrode 2, capacitances of the generated capacitors between certain number of electrode film bridges 051 in different phase controlling units 5 and the signal electrode 2 may be different, and thus phase shifting amounts adjusted correspondingly may be different. That is, each phase controlling unit 5 can adjust a corresponding phase shifting amount (e.g., the electrode film bridges 051 having a same filling pattern in FIG. 1 belong to a same phase controlling unit 5), such that when a phase shifting amount is to be adjusted (i.e., to be achieved), a voltage may be applied to a corresponding phase controlling unit 5 according to a magnitude of the phase shifting amount to be adjusted.

However, the inventors of the present inventive concept have found that, in the phase shifter shown in FIG. 1, although a certain number of electrode film bridges 051 in a same phase controlling unit 5 are connected to the controller unit 01 through a same signal line 02, the electrode film bridges 051 in a same phase controlling unit 5 are independent of each other. Thus, after the controller unit 01 outputs a DC bias voltage, the DC bias voltage is applied to the support portions of the different electrode film bridges 051 in the corresponding phase controlling unit 5, respectively. Therefore, DC bias voltages received by different electrode film bridges 051 may be different from each other to a certain extent, which causes the movements of the electrode film bridges 051 in the same phase controlling unit 5 to be different from each other, and thus capacitances of the capacitors formed by the electrode film bridges 051 in the same phase controlling unit 5 and the signal electrode 2 are different from each other, which causes the instability of the phase shifting amount. Further, since the support portion of each electrode film bridge 051 is fixed on the first insulating layer covering the reference electrode 3, the stress applied to the support portion of each electrode film bridge 051 by the first insulating layer is large, causing the mobility of each electrode film bridge 051 to be low. Therefore, a driving voltage (e.g., the DC bias voltage) is required to be large to drive the bridge floor portion of a corresponding electrode film bridge 051 to move.

At least to solve the above problems, other embodiments of the present disclosure provide a phase shifter as described below.

Figure 2:
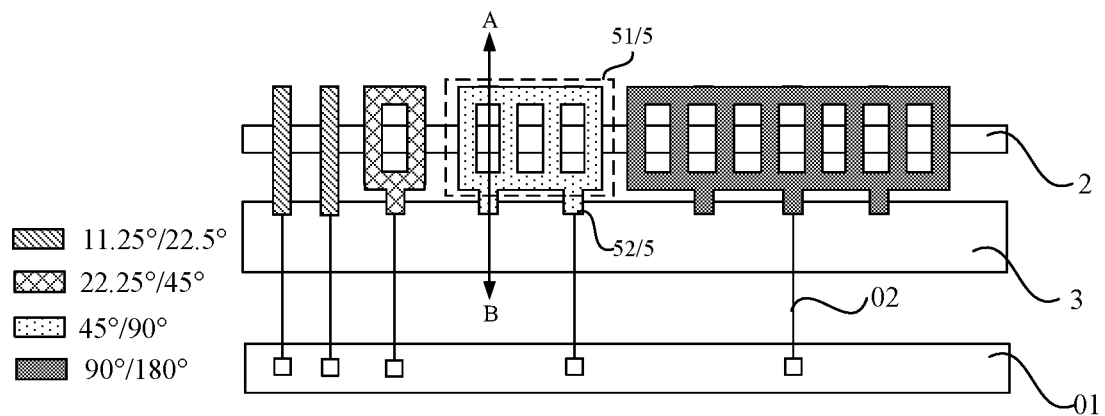
FIG. 2 is a schematic diagram (e.g., a top view) showing a structure of a phase shifter according to an embodiment of the present disclosure.
Figure 3:
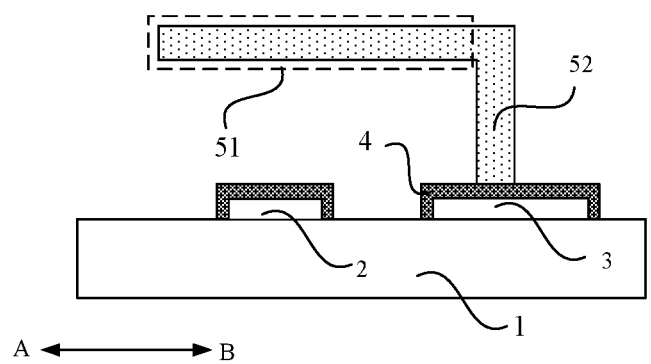
FIG. 3 is a cross-sectional view of the phase shifter shown in FIG. 2 taken along a direction A-B.
Figure 4:
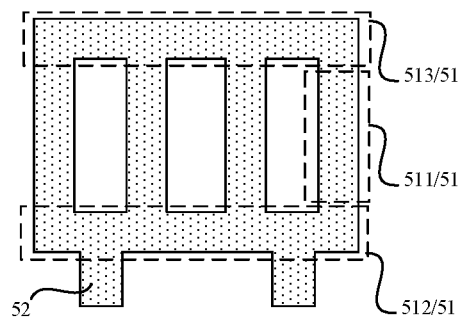
FIG. 4 is a schematic diagram showing an exemplary structure of a phase controlling unit of the phase shifter shown in FIG. 2.

In a first aspect, as shown in FIGS. 2 to 4, the present embodiment provides a phase shifter including a first substrate 1, a signal electrode 2, a reference electrode 3, a first insulating layer 4, and at least one phase controlling unit 5.

Specifically, referring to FIG. 3, both the signal electrode 2 and the reference electrode 3 are disposed on the first substrate 1, and the reference electrode 3 is located on least one side of an extension direction (e.g., a lengthwise direction) of the signal electrode 2. The signal electrode 2 and the reference electrode 3 form a coplanar waveguide (CPW) transmission line. The first insulating layer 4 is disposed on a side of the reference electrode 3 and the signal electrode 2 distal to the first substrate 1, to prevent signal crosstalk between the signal electrode 2, the reference electrode 3, and other structures. The at least one phase controlling unit 5 is arranged on a side of the first insulating layer 4 distal to the first substrate 1, and each phase controlling unit 5 corresponds to (e.g., achieves) a unique phase shifting amount. Each phase controlling unit 5 includes a main body portion 51 and at least one connection portion 52.

For example, an orthogonal projection of the main body portion 51 on the first substrate 1 at least partially overlaps an orthogonal projection of the signal electrode 2 on the first substrate 1. The at least one connection portion 52 is connected to the main body portion 51 and the first insulating layer 4 covering the reference electrode 3, respectively, and can support the main body portion 51 to form a gap between the main body portion 51 and the first insulating layer 4 on the signal electrode 2. As such, when a DC bias voltage is applied to the main body portion 51 of a phase controlling unit 5, a capacitor is formed between the main body portion 51 and the signal electrode 2 such that the CPW transmission line becomes a slow-wave system, thereby achieving the purpose of phase shifting. The main body portion 51 of each phase controlling unit 5 includes at least one first sub-electrode 511. In a case where the main body portion 51 of each phase controlling unit 5 includes a plurality of first sub-electrodes 511, the plurality of first sub-electrodes 511 are short-circuited with each other (e.g., connected to each other through a conductive metal line), and at least some of the plurality of first sub-electrodes 511 are connected to a same connection portion 52. It should be noted that, the phase shifter according to an embodiment of the present disclosure may be a Micro-Electro-Mechanical System (MEMS) phase shifter.

In the phase shifter according to an embodiment of the present disclosure, the main body portion 51 of each phase controlling unit 5 is suspended above the signal electrode 2 through a connection portion 52, and a DC bias voltage may be applied across the phase controlling unit 5 and the signal electrode 2. Specifically, the DC bias voltage is applied to a connection portion 52 of the phase controlling unit 5 and then transmitted to the main body portion 51 through the connection portion 52, such that an electrostatic attractive force can be generated between the main body portion 51 and the signal electrode 2, and the main body portion 51 can be driven to move toward the signal electrode 2 in a direction perpendicular to the signal electrode 2. That is, the main body portion 51 can be moved. Specifically, when a DC bias voltage is not applied across the main body portion 51 and the signal line 2 through a connection portion 52 of a phase controlling unit 5, an on-state capacitance (i.e., a capacitance when a signal passes through a switch) $C_{on}$ generated by the main body portion 51, a gap, the first insulating layer 4, and the signal electrode 2 in the phase controlling unit 5 is small, i.e., is on the order of fF (i.e., $10^{-15}$ farads), which is similar to a capacitance of a parallel plate capacitor. For example, the gap is a gap between the main body portion 51 and the first insulating layer 4 covering the signal electrode 2. Upon a DC bias voltage is applied across the main body portion 51 of a phase controlling unit 5 and the signal electrode 2 through a connection portion 52 of the phase controlling unit 5, the main body portion 51 changes a height of the gap under control of the electrostatic attractive force. When the applied DC bias voltage is sufficiently high, the main body portion 51 is pulled down by the electrostatic attractive force to be in close contact with the first insulating layer 4. In this case, a three-layer structure including the main body portion 51, the first insulating layer 4 and the signal electrode 2 in the phase controlling unit 5 forms an off-state capacitance $C_{off}$ having a large value on the order of pF (i.e., $10^{-12}$ farad). The phase shifting amount of each phase controlling unit 5 is determined by an overlapping area between the main body portion 51 of the phase controlling unit 5 and the signal electrode 2 and a ratio $C_{on}/C_{off}$ of the phase controlling unit 5. The DC bias voltage may be a driving voltage for each phase controlling unit, and the DC bias voltage is regarded as a driving voltage in the following description. In an embodiment of the present disclosure, since a certain number of the first sub-electrodes 511 of the main body portion 51 of each phase controlling unit 5 are short-circuited with each other, such that the first sub-electrodes 511 form the main body portion 51 that has a one-piece structure; and then are fixed on the first insulating layer 4 on the reference electrode 3 through a connection portion 52. As such, the DC bias voltage is transmitted from the connection portion 52 to the main body portion 51, and drives the entire main body portion 51 to move together (in a direction toward the signal electrode 2). Compared with a case where the first sub-electrodes 511 are driven to move individually, the uniformity of mechanical motion of the phase controlling unit 5 is improved by driving the entire main body portion 51 thereof to move together, thereby improving the stability of the phase shifting amount of the phase shifter. Thus, the mechanical motion is an important parameter of an MEMS phase shifter. Further, as described above, a portion of the plurality of first sub-electrodes 511 of a phase controlling unit 5 is fixed on the first insulating layer 4 on the reference electrode 3 through a same connection portion 52. Compared to the case where each electrode film bridge 051 is fixed to the first insulating layer on the reference electrode 3 as shown in FIG. 1, the phase shifter according to the present embodiment effectively reduces the number of connection portions 52 in each phase controlling unit 5, i.e., the number of fixing points (which are also referred to as anchor points) between each phase controlling unit 5 and the first insulating layer 4 is reduced, such that the stress applied to the main body portion 51 is reduced and the main body portion 51 can be moved more easily. Therefore, the main body portion 51 can be driven to move by a small DC bias voltage, thereby effectively reducing the DC bias voltage (i.e., the driving voltage) required for the phase shifter.

Figure 5:
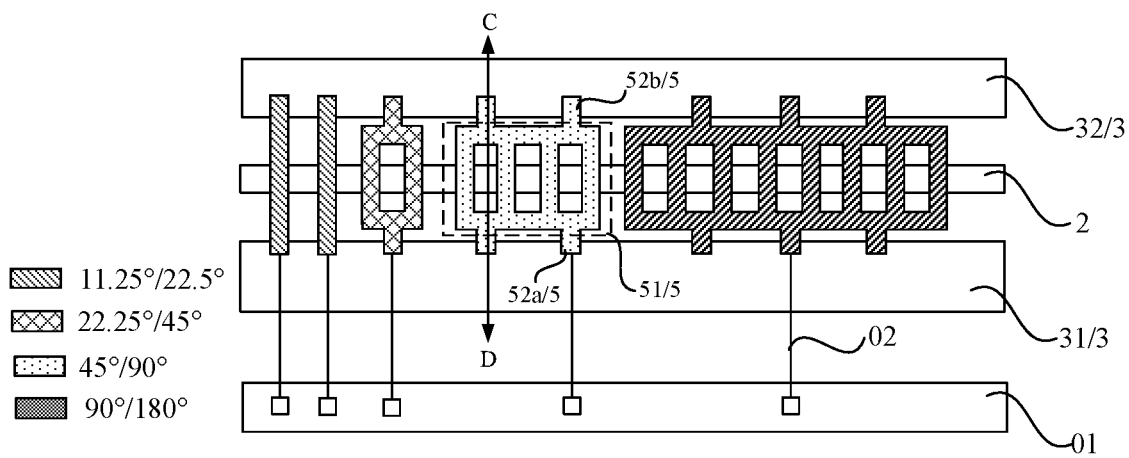
FIG. 5 is a schematic diagram (e.g., a top view) showing a structure of another phase shifter according to an embodiment of the present disclosure.
Figure 8:
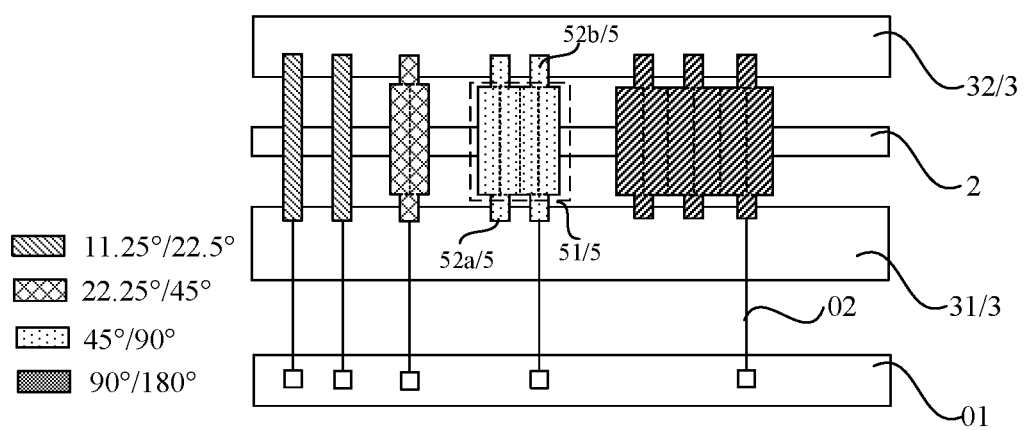
FIG. 8 is a schematic diagram (e.g., a top view) showing a structure of another phase shifter according to an embodiment of the present disclosure.

Further, the number of the first sub-electrodes 511 included in the main body portion 51 of one phase controlling unit 5 may be different from the number of the first sub-electrodes 511 included in the main body portion 51 of another phase controlling unit 5, and thus the capacitance of the capacitor generated between the main body portion 51 of one phase controlling unit 5 and the signal electrode 2 may be different from the capacitance of the capacitor generated between the main body portion 51 of another phase controlling unit 5 and the signal electrode 2. The larger the number of the first sub-electrodes 511 included in the main body portion 51 of a phase controlling unit 5 is, i.e., the larger the overlapping area between the main body portion 51 and the signal electrode 2 is, the larger the generated capacitance is and the larger effect of phase delay of the generated capacitance is. Therefore, the number of the first sub-electrodes 511 included in the main body portion 51 of each phase controlling unit 5 may be determined according to the required phase shifting amount. In an embodiment of the present disclosure (referring to, for example, FIG. 2, 5, or 8), description is made by taking an example in which the phase shifter is a four-bit phase shifter including four phase controlling unit 5, which are a phase controlling unit achieving a phase shifting amount of 11.25° to 22.5°, a phase controlling unit achieving a phase shifting amount of 22.5° to 45°, a phase controlling unit achieving a phase shifting amount of 45° to 90°, and a phase controlling unit achieving a phase shifting amount of 90° to 180°. The main body portions 51 of the four phase controlling units 5 include 1, 2, 4, and 8 first sub-electrodes 511, respectively. For example, the phase shifting amount generated by the capacitor formed by a single first sub-electrode 511 and the signal electrode 2 is 11.25°, such that the phase shifting amount of 11.25° corresponds to 1 (i.e., one) first sub-electrode 511, and the phase shifting amount generated when an electromagnetic wave passes through the leftmost two first sub-electrodes 51 as shown in FIG. 2, 5 or 8 is 22.5°. The leftmost two first sub-electrodes 51 may correspond to two first phase controlling units 5, respectively. A second phase controlling unit includes first sub-electrodes 511 short-circuited with each other. An electromagnetic wave passes through the two leftmost first sub-electrodes 511 and then passes through the first sub-electrode 511 of the second phase controlling unit to the second first sub-electrode 511 of the second phase controlling unit, the phase shifting amount is increased from 22.5° to 45°, and a change amount thereof is 22.5°. A third phase controlling unit includes 4 first sub-electrodes 511 short-circuited with each other. An electromagnetic wave passes through the two leftmost first sub-electrodes 511, next passes through the second phase controlling unit, then passes through the first sub-electrode 511 to the fourth first sub-electrode 511 of the third phase controlling unit, the phase shifting amount of the electromagnetic wave is changed from 45° to 90°, and a change amount thereof is 45°. The fourth phase controlling unit includes 8 first sub-electrodes 511 short-circuited with each other. An electromagnetic wave passes through the two leftmost first sub-electrodes 511, next passes through the second phase controlling unit, then passes through the third phase controlling unit, and finally passes through the first sub-electrode 511 to the eighth first sub-electrode 511 of the fourth phase controlling unit, the phase shifting amount of the electromagnetic wave is increased from 90° to 180°, and a change amount thereof is 90°. Alternatively, in an embodiment of the present disclosure, the phase shifter may further include more phase controlling units 5 respectively including different number of first sub-electrodes 511, which may be set as desired, and is not limited herein.

In some examples, referring to FIG. 4, taking the structure of the third phase controlling unit 5 achieving the phase shifting amount of 45° to 90° in the phase shifter as an example, the main body portion 51 of each phase controlling unit 5 includes a certain number of first sub-electrodes 511, and may further include a first short-circuiting portion 512 and a second short-circuiting portion 513. The first sub-electrodes 511 are short-circuited with each other. Specifically, one end of each of the first sub-electrodes 511 is connected to the first short-circuiting portion 512, and the other end of each of the first sub-electrodes 511 is connected to the second short-circuiting portion 513. Referring to FIG. 2, the at least one connection portion 52 has one end connected to the first short-circuiting portion 512 or the second short-circuiting portion 513, and the other end connected to the first insulating layer 4 on the reference electrode 3. In FIG. 2, the phase shifter is illustrated as including only one reference electrode 3, but the number of reference electrodes 3 may alternatively be 2 or more. For example, in the case where the number of the reference electrodes 3 is 2, two reference electrodes 3 may be positioned on the first substrate 1 and on both sides of the signal electrode 2, respectively, as illustrated in FIG. 1. Further, at least one connection portion 52 may be connected to each of two opposite sides of the main body portion 51 of each phase controlling unit 5, and one end of the at least one connection portion 52 connected to each of the two opposite sides of the main body portion 51 of each phase controlling unit 5 may be connected to a portion of the first insulating layer 4 on one of the two reference electrodes 3. Referring to FIGS. 2 and 3, in an embodiment, all of the first sub-electrodes 511 included in the main body portion 51 of each phase controlling unit 5 have a same distance from the signal electrode 2, thereby improving the stability of the phase shifting amount of the phase shifter. In an embodiment, all of the first sub-electrodes 511 included in all of the phase controlling units 5 have a same distance from the signal electrode 2, thereby further improving the stability of the phase shifting amount of the phase shifter and simplifying the manufacturing process of the phase shifter. In an embodiment, all of the first sub-electrodes 511 included in the main body portion 51 of each phase controlling unit 5 are parallel to each other, thereby simplifying the manufacturing process of the phase shifter. In an embodiment, all the first sub-electrodes 511 included in all of the phase controlling units 5 are parallel to each other, thereby further simplifying the manufacturing process of the phase shifter.

In some examples, the first sub-electrodes 511 may extend in a first direction (e.g., a vertical direction in FIG. 4), and the first short-circuiting portion 512 and the second short-circuiting portion 513 may extend in a second direction (e.g., a horizontal direction in FIG. 4). For example, the first direction and the second direction may be perpendicular to each other, and the second direction is parallel to the extension direction of the signal electrode 2 (referring to FIG. 2). Alternatively, the first sub-electrodes 511, the first short-circuiting portion 512, and the second short-circuiting portion 513 may extend in other directions, respectively, which is not limited herein.

It should be noted that, the number of the reference electrodes 3 provided by an embodiment of the present disclosure may be one (referring to FIG. 2), and the reference electrode 3 may be disposed on either side of the extension direction of the signal electrode 2. Alternatively, the reference electrode 3 may include a first reference electrode 31 and a second reference electrode 32 (referring to FIG. 5), and the first reference electrode 31 and the second reference electrode 32 are disposed on both sides of the extension direction of the signal electrode 2, respectively. The following description will be made by taking an example in which the reference electrode 3 includes the first reference electrode 31 and the second reference electrode 32.

Figure 6:
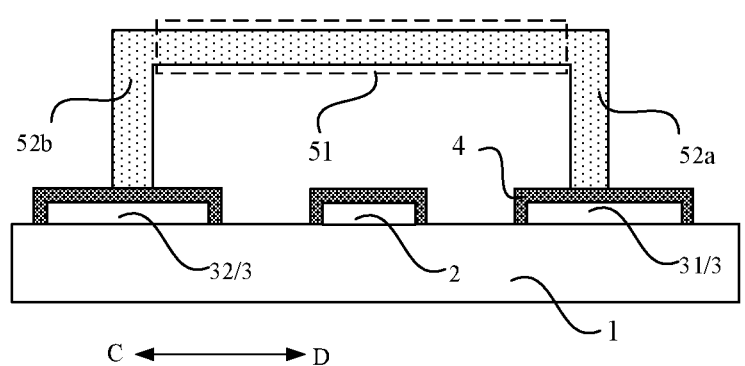
FIG. 6 is a schematic cross-sectional view of the phase shifter shown in FIG. 5 taken along a direction C-D.
Figure 7:
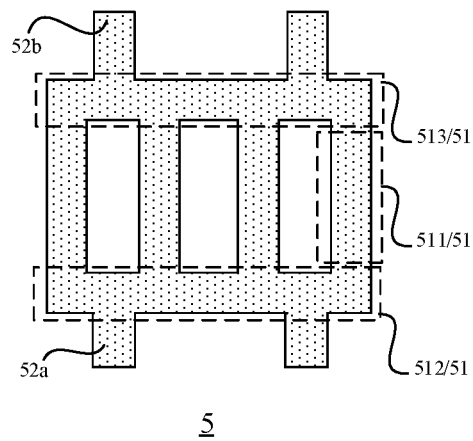
FIG. 7 is a schematic diagram showing an exemplary structure of a phase controlling unit of the phase shifter shown in FIG. 5.

In some examples, referring to FIGS. 5 to 7, the reference electrode 3 may include the first reference electrode 31 and the second reference electrode 32. The first reference electrode 31 and the second reference electrode 32 are respectively disposed on both sides of the extension direction of the signal electrode 2 (e.g., the upper side and the lower side of the signal electrode 2 as shown in FIG. 5), such that the signal electrode 2, the first reference electrode 31 and the second reference electrode 32 form a CPW transmission line. The main body portion 51 of each phase controlling unit 5 includes a certain number of first sub-electrodes 511, a first short-circuiting portion 512, and a second short-circuiting portion 513. One end of each of the first sub-electrodes 511 is connected to the first short-circuiting portion 512, and the other end of each of the first sub-electrodes 511 is connected to the second short-circuiting portion 513. For example, the first short-circuiting portion 512 is proximal to the first reference electrode 31, and the second short-circuiting portion 513 is proximal to the second reference electrode 32. Each phase controlling unit 5 may further include a plurality of connection portions 52, and the plurality of connection portions 52 may be divided into two groups. Taking the structure of the phase controlling unit 5 (e.g., the phase controlling unit 5 located within the dashed box shown in FIG. 5) achieving the phase shifting amount of 45° to 90° in the phase shifter as an example, the plurality of connection portions 52 may be equally divided into a first group of connection portions and a second group of connection portions. The connection portions in the first group of connection portions may be referred to as first connection portions 52a, and the connection portions in the second group of connection portions may be referred to as second connection portions 52b. One of the first and second groups of connection portions is connected between the first short-circuiting portion 512 of the main body portion 51 and a portion of the first insulating layer 4 covering the first reference electrode 31. For example, one end of each first connection portion 52a is connected to the first short-circuiting portion 512, and the other end thereof is connected to the portion of the first insulating layer 4 covering the first reference electrode 31. The other of the first and second groups of connection portions is connected between the second short-circuiting portion 513 of the main body portion 51 and a portion of the first insulating layer 4 covering the second reference electrode 32. For example, one end of each second connection portion 52b is connected to the second short-circuiting portion 513, and the other end thereof is connected to the portion of the first insulating layer 4 covering the second reference electrode 32. The first connection portions 52a in the first group of connection portions and the second connection portions 52b in the second group of connection portions suspend (or hang) the main body portion 51 above the signal electrode 2. The number of first connection portions 52a in the first group of connection portions may be the same as the number of second connection portions 52b in the second group of connection portions. A distance between any adjacent two of the first connection portions 52a is a constant, and a distance between any adjacent two of the second connection portions 52b is also a constant. That is, the first connection portions 52a are equally spaced apart from each other on the first short-circuiting portion 512, and the second connection portions 52b are equally spaced apart from each other on the second short-circuiting portion 513, so as to ensure the mechanical stability of the main body portion 51.

Figure 9:
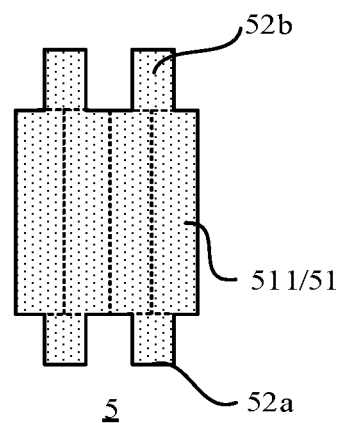
FIG. 9 is a schematic diagram showing an exemplary structure of a phase controlling unit of the phase shifter shown in FIG. 8.

In some examples, the plurality of first sub-electrodes 511 of the main body portion 51 of each phase controlling unit 5 may be spaced apart from each other, and short-circuited with each other by the first short-circuiting portion 512 and the second short-circuiting portion 513. In other examples, referring to FIGS. 8 and 9, the plurality of first sub-electrodes 511 of the main body portion 51 of each phase controlling unit 5 may have a one-piece structure, have no gap therebetween (i.e., in contact with each other), and form a sheet-like structure. That is, the main body portion 51 has a one-sheet-like structure. Similar to the embodiment shown in FIG. 5, the at least one connection portion 52 is connected between the sheet-like structure (i.e., the main body portion 51) and the first insulating layer 4 covering the reference electrode 3 to support the sheet-like structure above the signal electrode 2, and the sheet-like structure and the signal electrode 2 form a capacitor therebetween.

Similar to the above, the number of the reference electrodes 3 may be one, and the at least one connection portion 52 is connected between the reference electrode 3 and the main body portion 51 having the sheet-like structure (similar to the case shown in FIGS. 2 and 3). The reference electrode 3 may alternatively include the first reference electrode 31 and the second reference electrode 32. The first reference electrode 31 and the second reference electrode 32 are respectively disposed on both sides of the extension direction of the signal electrode 2, and the signal electrode 2, the first reference electrode 31 and the second reference electrode 32 form a CPW transmission line (similar to the case shown in FIGS. 5 and 6). A certain number of first sub-electrodes 511 of each phase controlling unit 5 form the sheet-like structure, which is a one-piece structure, as the main body portion 51. Each phase controlling unit 5 may further include a plurality of connection portions 52, and the plurality of connection portions 52 are equally divided into two groups. Taking the structure of the phase controlling unit 5 (e.g., the phase controlling unit 5 located within the dotted box shown in FIG. 8) achieving the phase shifting amount of 45° to 90° in the phase shifter as an example, the plurality of connection portions 52 may be equally divided into the first group of connection portions and the second group of connection portions. The connection portions in the first group of connection portions are referred to as first connection portions 52a, and the connection portions in the second group of connection portions are referred to as second connection portions 52b. One of the first and second groups of connection portions is connected between the side, which is proximal to the first reference electrode 31, of the main body portion 51 having the sheet-like structure and a portion of the first insulating layer 4 covering the first reference electrode 31. For example, one end of each first connection portion 52a is connected to the side, which is proximal to the first reference electrode 31, of the main body portion 51 having the sheet-like structure, and the other end thereof is connected to the portion of the first insulating layer 4 covering the first reference electrode 31. The other group of the first and second groups of connection portions is connected between the side, which is proximal to the second reference electrode 32, of the main body portion 51 having the sheet-like structure and a portion of the first insulating layer 4 covering the second reference electrode 32. That is, one end of each second connection portion 52b is connected to the side, which is proximal to the second reference electrode 32, of the main body portion 51 having the sheet-like structure, and the other end thereof is connected to the portion of the first insulating layer 4 covering the second reference electrode 32. The first connection portion 52a in the first group of connection portions and the second connection portion 52b in the second group of connection portions suspend (or hang or support) the main body portion 51 above the signal electrode 2. The number of first connection portions 52a in the first group of connection portions may be the same as the number of second connection portions 52b in the second group of connection portions. A distance between any adjacent two of the first connection portions 52a is a constant, and a distance between any adjacent two of the second connection portions 52b is also a constant. That is, the first connection portions 52a are equally spaced apart from each other on the side, which is proximal to the first reference electrode 31, of the main body portion 51 having the sheet-like structure, and the second connection portions 52b are equally spaced apart from each other on the side, which is proximal to the second reference electrode 32, of the main body portion 51 having the sheet-like structure, to ensure the mechanical stability of the main body portion 51.

In the phase shifter according to an embodiment of the present disclosure, the main body portion 51 of each phase controlling unit 5 may include the plurality of first sub-electrodes 511, which may be spaced apart from each other, or may be the sheet-like structure having a one-piece structure formed by the plurality of first sub-electrodes 511. Alternatively, the plurality of first sub-electrodes 511 may be arranged in other manners to form the main body portion 51. In the above-described embodiments, except the phase controlling unit 5 including a single first sub-electrode 511, the number of connection portions in either one of the two groups of connection portions 52 (as shown in FIG. 2) or the two groups of connection portions 52a and 52b (as shown in FIGS. 5 and 8) of each phase controlling unit 5 is less than the number of first sub-electrodes 511 of the main body portion 51 of the phase controlling unit 5, thereby reducing the number of connection points between the phase controlling unit 5 and the first insulating layer 4, and thus, allowing the main body portion 51 to move more easily under the electrostatic attractive force. In an embodiment, the number of the connection portions in any one of the two groups of connection portions 52 or in any one of the two groups of connection portions 52a and 52b of a phase controlling unit 5 is equal to or less than one half (i.e., ½) of the number of the first sub-electrodes 511 of the main body portion 51 of the phase controlling unit 5. As shown in FIGS. 2, 5, and 8, except the leftmost two phase controlling units 5 each including a single first sub-electrode 511, for the remaining three phase controlling units 5, the numbers of first sub-electrodes 511 of the main body portions 51 may be 2, 4 and 8, respectively, and the number of connection portions 52 (or 52a or 52b) in one group of connection portions corresponding to one reference electrode 3 may be 1, 2 and 4, respectively. Alternatively, the number of the connection portions 52 (or 52a or 52b) may be further reduced, as long as a sufficient supporting force can be provided to the main body portion 51. For example, as shown in FIGS. 2, 5 and 8, for the rightmost phase controlling unit 5, the number of the first sub-electrodes 511 of the main body portion 51 is 8, and the number of the connection portions in each group of the connection portions 52 or 52a or 52b is 3.

In an embodiment, the first sub-electrodes 511 of the main body portion 51 of each phase controlling unit 5 may have a same width (i.e., a dimension in the extension direction of the signal electrode 2, as shown in FIG. 2, 5, or 8), such that the overlapping areas between the first sub-electrodes 511 and the signal electrode 2 are equal to each other. Further, a distance between any adjacent two of the first sub-electrodes 511 is a constant, i.e. the first sub-electrodes 511 are equally spaced apart from each other, thereby simplifying the manufacturing process of the phase shifter. Alternatively, the widths of the first sub-electrodes 511 may be different from each other, and the distances between every adjacent two of the first sub-electrodes 511 may be different from each other, which may be set as desired and is not limited herein.

In some examples, the phase shifter according to an embodiment of the present disclosure may further include a controller unit 01 and a plurality of signal lines 02. The controller unit 01 can provide a direct current (DC) bias voltage. The controller unit 01 includes a plurality of output ports, each of which outputs a direct current bias voltage. One end of each signal line 02 is connected to one output port of the controller unit 01, and the other end thereof is connected to one phase controlling unit 5, such that a DC bias voltage from the controller unit 01 is supplied to the phase controlling unit 5 via the signal line 02. Specifically, each signal line 02 is connected to the connection portion 52 (or 52a or 52b) of one phase controlling unit 5, and if the phase controlling unit 5 includes a plurality of connection portions 52, the signal line 02 may be connected to any one of the plurality of connection portions 52 of one phase controlling unit 5. Compared with a case where each first sub-electrode 511 is connected with one signal line 02 and the signal lines 02 of the first sub-electrodes 511 of a same phase controlling unit 5 are connected to one output port of the controller unit 01, the present embodiment effectively reduces the number of the signal lines 02. Further, each phase controlling unit 5 receives the DC bias voltage output from a same signal line 02, thereby effectively ensuring the consistency of DC bias voltages received by the first sub-electrodes 511 of each phase controlling unit 5.

Figure 10:
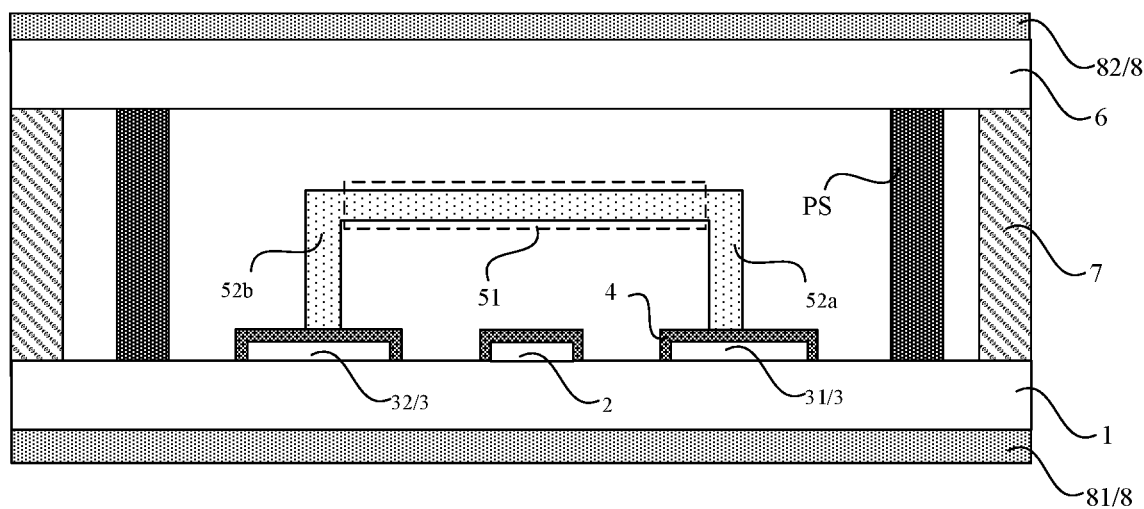
FIG. 10 is a schematic cross-sectional view showing a structure of a phase shifter according to an embodiment of the present disclosure.

In some examples, external environmental factors (e.g., a pressure, a temperature, an ambient stress) may affect the stability of the performance of the phase shifter during operation of the phase shifter, and for this purpose, the phase shifter may be packaged to improve the stability of the performance of the phase shifter in various external environments. Referring to FIG. 10, the phase shifter according to an embodiment of the present disclosure may further include a second substrate 6 which is disposed opposite to the first substrate 1, and on a side of the plurality of phase controlling units 5 distal to the first substrate 1. Specifically, the second substrate 6 is disposed on a side of the main body portions 51 of the plurality of phase controlling units 5 distal to the first substrate 1, and a gap is provided between the second substrate 6 and the plurality of phase controlling units 5, such that the second substrate 6 has no influence on the mechanical movement of the main body portions 51 of the phase controlling units 5. The phase shifter may further include a sealing structure 7 disposed between the first substrate 1 and the second substrate 6, and the sealing structure 7 is disposed in a peripheral region of the first substrate 1, to seal the first substrate 1 and the second substrate 6 for being isolated (or insulated) from external water and oxygen, and thus protecting an internal structure of the phase shifter. Further, an orthogonal projection of the sealing structure 7 on the first substrate 1 does not overlap an orthogonal projection of the plurality of phase controlling units 5 on the first substrate 1. That is, the sealing structure 7 is not in contact with the plurality of phase controlling unit 5, and the sealing structure 7 is disposed in the peripheral region of the first substrate 1. For example, an outer side of the sealing structure 7 (e.g., a sealing structure on the right as shown in FIG. 10), an outer side of the corresponding end (e.g., the right end as shown in FIG. 10) of the first substrate 1, and an outer side of the corresponding end (e.g., the right end as shown in FIG. 10) of the second substrate 6 may be flush with (or aligned with) each other.

In some examples, the sealing structure 7 may include a sealing adhesive or the like, and may encapsulate and assemble the first substrate 1 and the second substrate 6. In order to isolate (or avoid) the influence of the external temperature on the stability of the performance of the phase shifter, the sealing structure 7 may be doped with a heat insulating material in a certain proportion, such as glass fiber, asbestos, rock wool, silicate, and/or aerogel blanket. In other words, the sealing structure 7 may include a mixture of the sealing adhesive and the heat insulating material.

In some examples, to further insulate the external temperature, the phase shifter may further include at least one heat insulating layer 8, and the at least one heat insulating layer 8 may be disposed on a side of at least one of the first substrate 1 and the second substrate 6 distal to the plurality of phase controlling units 5 to insulate the external temperature. For example, two heat insulating layers may be provided on the outer sides of the first substrate 1 and the second substrate 6 (i.e., on the sides of the first substrate 1 and the second substrate 6 distal to the plurality of phase controlling units 5), respectively. In particular, the at least one heat insulating layer 8 may include a first heat insulating layer 81 and a second heat insulating layer 82. The first heat insulating layer 81 may be provided on the side of the first substrate 1 distal to the plurality of phase controlling units 5, and the second heat insulating layer 82 may be provided on the side of the second substrate 6 distal to the plurality of phase controlling units 5. The material of each heat insulating layer 8 may be various, for example, may be a thermal insulation ceramic, an organic film, or the like, and is not limited herein.

In some examples, in order to maintain a certain distance between the first substrate 1 and the second substrate 6, the phase shifter may further include a plurality of spacers PS disposed between the first substrate 1 and the second substrate 6, and the plurality of spacers PS are disposed on a side of the sealing structure 7 proximal to the plurality of phase controlling units 5, i.e., the plurality of spacers PS are disposed inside the sealing structure 7. For example, each spacer PS may be provided between the plurality of phase controlling units 5 and the sealing structure 7, and an orthogonal projection of each spacer PS on the first substrate 1 does not overlap the orthogonal projection of the plurality of phase controlling units 5 on the first substrate 1.

In some examples, a heat insulating material (not shown) may also be disposed between the spacer PS and the sealing structure 7 to further insulate the phase shifter from the external ambient temperature. For example, similar to each heat insulating layer 8, each spacer PS may be an organic film or the like, to simultaneously have a function of maintaining the distance between the first substrate 1 and the second substrate 6 and a function of thermal insulation.

The phase shifter according to an embodiment of the present disclosure may be manufactured through a silicon-based substrate process or a glass substrate process. That is, at least one of the first substrate 1 and the second substrate 6 may be a glass substrate or a silicon-based substrate, which is not limited herein.

Figure 11:
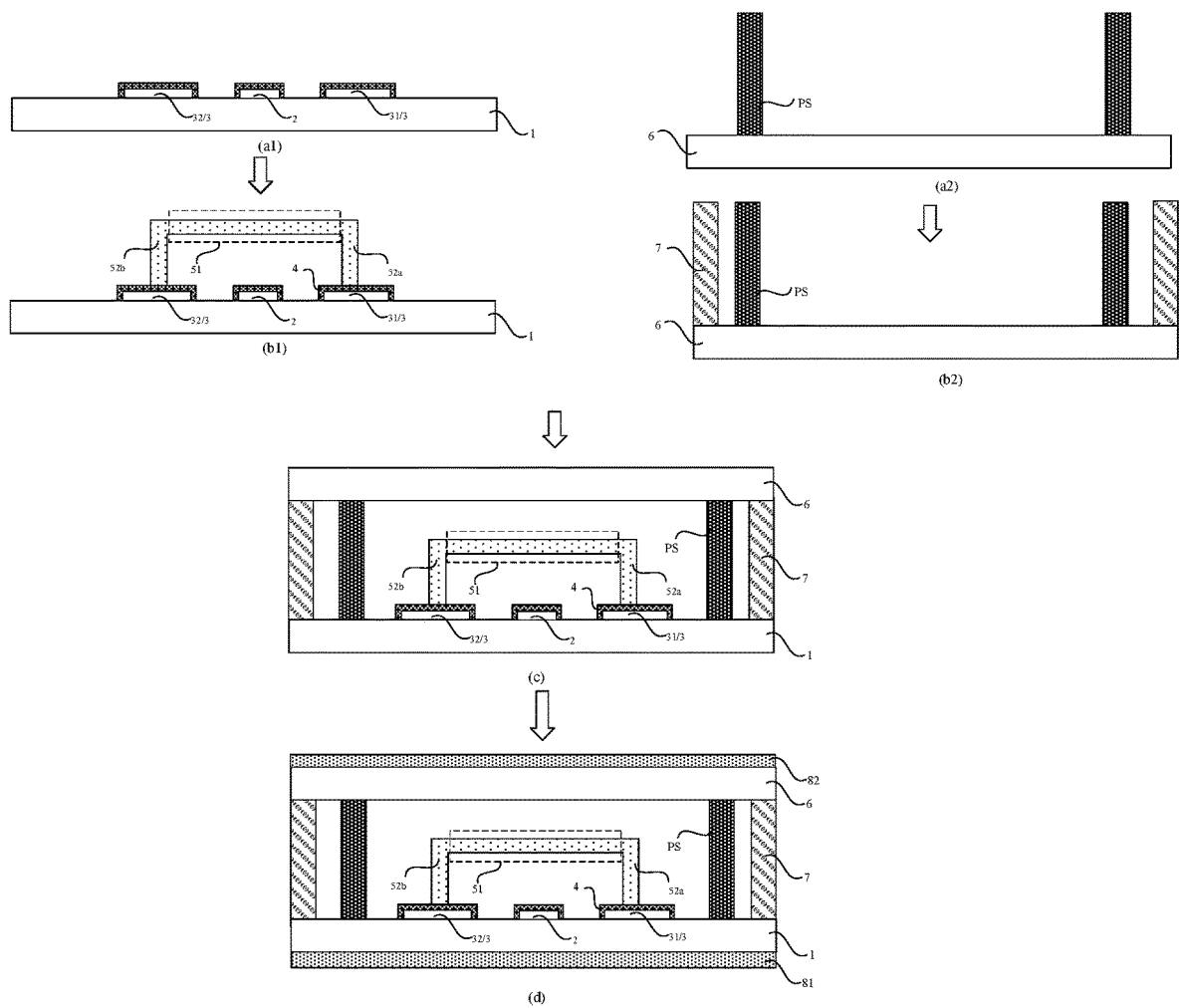
FIG. 11 is a schematic diagram showing steps of a method for manufacturing a phase shifter according to an embodiment of the present disclosure.

In a second aspect, referring to FIG. 11, an embodiment of the present disclosure provide a method for manufacturing a phase shifter, and the method may include the following steps S1 to S4.

Step S1 may include providing the first substrate 1 and the second substrate 6.

Specifically, at least one of the first substrate 1 and the second substrate 6 may be a glass substrate or a silicon-based substrate, and the first substrate 1 and/or the second substrate 6 are subjected to processes such as cleaning and drying.

Step S2 may include forming the signal electrode 2 and the reference electrode 3 on the first substrate 1, forming the first insulating layer 4 on the signal electrode 2 and the reference electrode 3; and coating a material of a spacer PS on the second substrate 6 to form the spacer.

Specifically, referring to part (a1) of FIG. 11, a first electrode layer may be formed on one side of the first substrate 1 through a sputtering process or the like, and then may be subjected to exposure, etching, development, and/or the like to form a pattern of, for example, one signal electrode 2 and two reference electrodes 3, such that the two reference electrodes 3 are located on both sides of the signal electrode 2 and spaced apart from the signal electrode 2, respectively. Further, the first insulating layer 4 is deposited on the side of the signal electrode 2 and the reference electrodes 3 distal to the first substrate 1, such that the first insulating layer 4 is coated outside the signal electrode 2 and the reference electrodes 3.

Next, referring to part (a2) of FIG. 11, an organic film having a thickness of 5 um to 7 um may be formed on one side of the second substrate 6, and may be subjected to exposure, etching, development, and/or the like to form to form the spacer(s) PS.

Step S3 may include forming at least one phase controlling unit 5 on the first insulating layer 4, and coating a material of a sealing structure 7 on the second substrate 6 to form the sealing structure 7.

Specifically, referring to part (b1) of FIG. 11, a second metal layer may be formed on the first insulating layer 4 which is on the first substrate 1, and be subjected to an etching process to form the main body portion(s) 51 and the connection portion(s) 52 of the at least one phase controlling unit 5.

Further, referring to part (b2) of FIG. 11, a material of a sealing adhesive is coated on the side of the second substrate 6 where the spacer PS is formed, and may be subjected to exposure, etching, development, and/or the like to form the sealing structure 7 in the peripheral region of the second substrate 6 and outside the spacer PS.

Step S4 may include aligning and assembling the first substrate 1 and the second substrate 6 formed in the above steps into a cell, forming the first heat insulating layer 81 on the outer side of the first substrate 1, and forming the second heat insulating layer 82 on the outer side of the second substrate 6.

Specifically, referring to part (c) of FIG. 11, the first substrate 1 and the second substrate 6 are aligned and assembled into a cell in a vacuum environment to realize encapsulation (or packaging). Such vacuum encapsulation can effectively isolate external heat exchange, thereby ensuring that the phase shifter has stable performance at a temperature of an operation environment.

Further, referring to part (d) of FIG. 11, to further improve the stability of the performance of the phase shifter at different temperatures, an organic film (which may be made of, for example, a superpolymer) is coated or a thermal insulation ceramic film is formed through an evaporation process on the side of the first substrate 1 distal to the second substrate 6, after the first substrate 1 and the second substrate 6 are aligned and assembled into a cell, to form the first heat insulating layer 81; and an organic film (which may be made of, for example, a superpolymer) is coated or a thermal insulation ceramic film is formed through an evaporation process on the side of the second substrate 6 distal to the first substrate 1, after the first substrate 1 and the second substrate 6 are aligned and assembled into a cell, to form the second heat insulating layer 82.

It should be understood that, in addition to the above-described steps S1 to S4, the method may further include steps for forming other components in the phase shifter provided by the present disclosure.

It should be understood that the above-described embodiments of the present disclosure may be combined with each other in a case of no explicit conflict.

It should be understood that the above embodiments are merely exemplary embodiments adopted to explain the principles of the present disclosure, and the present disclosure is not limited thereto. It will be apparent to one of ordinary skill in the art that various changes and modifications can be made therein without departing from the spirit and scope of the present disclosure, and such changes and modifications also fall within the scope of the present disclosure.

What is claimed is:

1. A phase shifter, comprising:
    a first substrate;
    a signal electrode and a reference electrode on at least one side of an extension direction of the signal electrode, wherein both the signal electrode and the reference electrode are on the first substrate;
    a first insulating layer on a side of the reference electrode and the signal electrode distal to the first substrate; and
    at least one phase controlling unit on a side of the first insulating layer distal to the first substrate, wherein each phase controlling unit comprises a main body portion and at least one connection portion; an orthogonal projection of the main body portion on the first substrate at least partially overlaps an orthogonal projection of the signal electrode on the first substrate; the main body portion and the first insulating layer have a gap therebetween; and the at least one connection portion is connected between the main body portion and a portion of the first insulating layer covering the reference electrode;

wherein the main body portion comprises a plurality of first sub-electrodes short-circuited with each other; and at least some of the plurality of first sub-electrodes are connected to a same connection portion.

2. The phase shifter according to claim 1, wherein the main body portion further comprises a first short-circuiting portion and a second short-circuiting portion, one end of each of the plurality of first sub-electrodes is connected to the first short-circuiting portion, and the other end of each of the plurality of first sub-electrodes is connected to the second short-circuiting portion; and the at least one connection portion is connected to one of the first short-circuiting portion and the second short-circuiting portion.

3. The phase shifter according to claim 2, wherein the reference electrode comprises a first reference electrode and a second reference electrode, which are on both sides of the extension direction of the signal electrode, respectively; and each phase controlling unit comprises a plurality of connection portions which are equally divided into two groups, one group of which is connected between the first short-circuiting portion and a portion of the first insulating layer covering the first reference electrode; and the other group thereof is connected between the second short-circuiting portion and a portion of the first insulating layer covering the second reference electrode.

4. The phase shifter according to claim 1, wherein the plurality of first sub-electrodes of each phase controlling unit have a one-piece structure and form a sheet-like structure; the at least one connection portion is connected between the sheet-like structure and the portion of the first insulating layer covering the reference electrode.

5. The phase shifter according to claim 4, wherein the reference electrode comprises a first reference electrode and a second reference electrode, which are on both sides of the extension direction of the signal electrode, respectively; and each phase controlling unit comprises a plurality of connection portions which are equally divided into two groups, one of which is connected between a side of the sheet-like structure proximal to the first reference electrode and a portion of the first insulating layer covering the first reference electrode; and the other thereof is connected between a side of the sheet-like structure proximal to the second reference electrode and a portion of the first insulating layer covering the second reference electrode.

6. The phase shifter according to claim 3, wherein a number of the connection portions in either of the two groups of a phase controlling unit is less than or equal to one half of a number of the first sub-electrodes of the phase controlling unit.

7. The phase shifter according to claim 5, wherein a number of the connection portions in either of the two groups of a phase controlling unit is less than or equal to one half of a number of the first sub-electrodes of the phase controlling unit.

8. The phase shifter according to claim 1, wherein the plurality of first sub-electrodes have a same width, and a distance between any adjacent two of the plurality of first sub-electrodes is a constant.

9. The phase shifter according to claim 1, further comprising: a controller unit and a plurality of signal lines; one end of each signal line is connected to the controller unit; and the other end of each signal line is connected to any one of the at least one connection portion in one of the at least one phase controlling unit.

10. The phase shifter according to claim 1, further comprising:
a second substrate opposite to the first substrate and on a side of the at least one phase controlling unit distal to the first substrate, and the second substrate and the at least one phase controlling unit have a gap therebetween; and
a sealing structure between the first substrate and the second substrate and in a peripheral region of the first substrate; and an orthogonal projection of the sealing structure on the first substrate does not overlap an orthogonal projection of the at least one phase controlling unit on the first substrate.

11. The phase shifter according to claim 10, wherein the sealing structure comprises a heat insulating material.

12. The phase shifter according to claim 10, further comprising: at least one heat insulating layer on a side, which is distal to the at least one phase controlling unit, of at least one of the first substrate and the second substrate.

13. The phase shifter according to claim 12, wherein the at least one heat insulating layer comprises a first heat insulating layer and a second heat insulating layer; the first heat insulating layer is on the side, which is distal to the at least one phase controlling unit, of the first substrate; and the second heat insulating layer is on the side, which is distal to the at least one phase controlling unit, of the second substrate.

14. The phase shifter according to claim 10, further comprising: a plurality of spacers between the first substrate and the second substrate, and on a side of the sealing structure proximal to the at least one phase controlling unit.

15. The phase shifter according to claim 10, wherein at least one of the first substrate and the second substrate is a glass substrate or a silicon-based substrate.

16. The phase shifter according to claim 1, wherein the plurality of first sub-electrodes have a same distance from the signal electrode.

17. The phase shifter according to claim 16, wherein all of the first sub-electrodes of the at least one phase controlling unit have the same distance from the signal electrode.

18. The phase shifter according to claim 1, wherein the plurality of first sub-electrodes are parallel to each other.

19. The phase shifter according to claim 18, wherein all of the first sub-electrodes of the at least one phase controlling unit are parallel to each other.

20. The phase shifter according to claim 11, wherein each of the at least one heat insulating layer comprises a thermal insulation ceramic or an organic film.

\* \* \* \* \*